United States Patent [19] [11] Patent Number: 5,234,502
Mochizuki et al. [45] Date of Patent: Aug. 10, 1993

[54] MICROWAVE PLASMA CHEMICAL VAPOR DEPOSITION APPARATUS COMPRISING AN INCLINED ROTATING SUBSTRATE HOLDER

[75] Inventors: Osamu Mochizuki; Hiroaki Itoh; Toshiharu Hoshi, all of Hamamatsu, Japan

[73] Assignee: Yamaha Corporation, Hamamatsu, Japan

[21] Appl. No.: 665,580

[22] Filed: Mar. 6, 1991

[51] Int. Cl.5 .............................................. C23C 16/50
[52] U.S. Cl. .................................... 118/723; 118/730; 156/DIG. 68
[58] Field of Search ............................... 118/723, 730; 156/DIG. 68, 345

[56] References Cited

U.S. PATENT DOCUMENTS 4,785,763 11/1988 Saitoh .................................. 118/723
4,818,561 4/1989 Strahl .................................. 118/730
4,946,537 8/1990 Hijikata et al. ..................... 156/345
5,130,111 7/1992 Pryor ............................ 156/DIG. 68

FOREIGN PATENT DOCUMENTS 230959 1/1987 European Pat. Off. .
63-17994 5/1988 Japan ........................ 156/DIG. 68
1-222060 9/1989 Japan .
1-242775 9/1989 Japan .................................. 118/723
1-257196 10/1989 Japan .

OTHER PUBLICATIONS

"Texture of Vapor Deposited Diamond Films as Revealed by Plasma-Etching", by Hata, Chiemi et al., Science and Technology of New Diamond, KTK Scientific Publishers, Terra Scientific Publishing Company, 1990, pp. 95-100.
"Emerging Technology of Diamond Thin Films", May 15, 1989, C&EN.

Primary Examiner—Brian E. Hearn
Assistant Examiner—Jonathan D. Baskin
Attorney, Agent, or Firm—Burns, Doane, Swecker & Mathis

[57] ABSTRACT

A chemical vapor deposition apparatus deposits a thin film on a substrate according to a chemical vapor deposition method by using plasma energy and reaction gas. The chemical vapor deposition apparatus comprises at least a reaction tube, a waveguide and a substrate holder. The reaction tube is inserted through the waveguide to thereby form a reaction vessel. The reaction tube is connected with a reaction gas source, and reaction gas is introduced into the reaction tube. The substrate holder is placed at an area in which the reaction tube and the waveguide intersect. The substrate holder provides a rotation axis for rotating the substrate, and the waveguide is provided such that a center axis thereof is inclined in relation to a center axis of the substrate holder. In addition, the substrate holder can be freely rotated around the center axis thereof. By rotating the substrate so that a plasma is generated at the position opposite to and inclined against the substrate, all portions of the substrate are heated uniformly. Thus, a thin film having uniform thickness can be deposited over the entire surface of the substrate.

12 Claims, 7 Drawing Sheets

MICROWAVE PLASMA CHEMICAL VAPOR DEPOSITION APPARATUS COMPRISING AN INCLINED ROTATING SUBSTRATE HOLDER

BACKGROUND OF THE INVENTION

1. Field of the Invention

The present invention relates to a chemical vapor deposition apparatus in which a thin film is formed according to the chemical vapor deposition method by using plasma energy and reaction gas.

2. Prior Art

Conventionally, there is a well-known plasma enhanced chemical vapor deposition apparatus (hereinafter, simply referred to as PCVD apparatus), which has a waveguide 1, a reaction tube 2, and a substrate holder 3, as shown in FIG. 14. Herein, the waveguide 1 is vertical, and the reaction tube 2 is provided through the waveguide 1 in such a manner that the reaction tube 2 is positioned against the waveguide 1 in the vertical direction. In addition, the substrate holder 3 is provided at a location where waveguide 1 and reaction tube 2 cross.

In this PCVD apparatus, a substrate 4 is placed on the substrate holder 3, and the reaction gas is supplied to the reaction tube 2 from a gas supply source. In addition, microwaves are introduced into the waveguide 1 from a suitable oscillator so that they propagate through the waveguide 1, whereby plasma is generated around the substrate 4. As a result, the reaction gas around the substrate 4 is decomposed into its components by effect of the plasma generated around the substrate 4, so that the components thus decomposed are deposited on the surface of the substrate 4. In this way, a thin film having the desired composition is formed on the surface of the substrate 4.

As another example of the conventional PCVD apparatus, there is a known apparatus in which the horizontal reaction tube 2 is inserted through the vertical waveguide 1, and the substrate holder 3 is provided in a portion of the waveguide 1 at which the reaction tube 2 is crossed as shown in FIG. 15.

In the case of the conventional PCVD apparatuses described above, wherein the substrate 4 is shaped three-dimensionally like a dome, a strong plasma 5 is generated over the substrate 4, as shown in FIG. 16, so that the reaction gas around the circumference of the substrate 4 is decomposed by the plasma and the components thus decomposed are deposited on the surface of the substrate 4. As a result, the thin film 6 is formed on the peripheral surface of the substrate 4 as shown in FIG. 17.

However, in the case where the thin film is formed by the conventional PCVD apparatus described above, the thickness of the thin film increases toward the upper portion of the substrate 4, while the thickness decreases toward the lower portion of the substrate 4. In an extreme case, the ratio of the thick portion to the thin portion may be as high as 4:1.

Thus, specific research has occurred to determine the reason why such thickness differences occur. The results indicate that the relative position relationship between the strong plasma (the strongest part of the plasma) and the substrate produces important effects on the manner of formation of the thin film. More specifically, in the case where the thin film is deposited on a substrate which is shaped three-dimensionally like a dome, the interaction of the plasma impact becomes weaker as the distance between the substrate and the strong plasma becomes larger, while the interaction of the electron impact becomes stronger as the distance from the substrate to the strong plasma becomes smaller. Therefore, the upper portion of the substrate will be at a high temperature, while the lower portion thereof will be at a low temperature, so that the temperature distribution is nonuniform. As a result, it seems that the thickness of the thin film varies because of the above phenomenon.

Furthermore, in the conventional PCVD apparatuses shown in FIGS. 14 find 15, the reaction tube 2 is designed to pass through the waveguide 1 so that the reaction tube 2 cannot be formed largely because leakage of electromagnetic waves generated through the reaction tube 2 must be prevented. Thus, there is a problem in that a large substrate cannot be used.

SUMMARY OF THE INVENTION

In consideration of the above-described shortcomings of the conventional chemical vapor deposition apparatus, a primary object of the present invention is to provide a chemical vapor deposition apparatus in which the variation in the thickness of the thin film can be reduced to less than 10 percent, even if the thin film is deposited on a substrate having a three-dimensional shape like a dome.

A further object of the present invention is to provide a chemical vapor deposition apparatus in which the thin film can be deposited on a large substrate.

Another object of the present invention is to provide a chemical vapor deposition apparatus in which a high-quality thin film can be formed with satisfactory reproducibility.

In a first aspect of the invention, there is provided a chemical vapor deposition apparatus for depositing a thin film on a substrate according to a chemical vapor deposition method by using plasma energy and reaction gas, said chemical vapor deposition apparatus comprising:

(a) a waveguide for guiding microwaves contained therein;

(b) a reaction tube inserted through said waveguide, said reaction tube connected with a reaction gas source, wherein the reaction gas is introduced into said reaction tube from said reaction gas source;

(c) a substrate holder for holding said substrate thereon, said substrate holder being placed at an intersection of said reaction tube and said waveguide, said substrate holder providing a single rotation axis about which said substrate is to be rotated, wherein said waveguide is provided such that a center axis thereof is inclined against a center axis of said substrate holder, and said substrate holder is provided around the center axis of said rotation axis so that it can be freely rotated.

In a second aspect of the invention, there is provided a chemical vapor deposition apparatus for depositing a thin film on a substrate according to a chemical vapor deposition method by using plasma energy and reaction gas, said chemical vapor deposition apparatus comprising:

(a) a waveguide connected with an oscillator for generating microwaves to be introduced therein;

(b) a reaction vessel provided in said waveguide by partitioning off said waveguide;

(c) a reaction gas introduction port provided on said reaction vessel, by which said reaction gas is introduced into said reaction vessel;

(d) a pumping means for pumping air out of said reaction vessel; and (e) a substrate holder for holding said substrate therein, said substrate holder being provided within said reaction vessel, said substrate holder providing a rotation axis for rotating said substrate, wherein said substrate holder is provided such that a center axis thereof is inclined against a center axis of said waveguide, and said substrate holder is provided around the center axis of said rotation axis so that it can be freely rotated.

In a third aspect of the invention, there is provided a chemical vapor deposition apparatus for depositing a thin film on a substrate according to a chemical vapor deposition method by using plasma energy and reaction gas, said chemical vapor deposition apparatus comprising:

(a) a reaction vessel connected with a gas introduction tube for introducing the gas therein and a gas exhaust tube for exhausting air from said reaction vessel;

(b) a waveguide connected with an oscillator for generating microwaves to be introduced therein, said waveguide being divided into two parts;

(c) a pumping means for pumping air out of said reaction vessel;

(d) a substrate holder for holding said substrate therein, said substrate holder being provided within said reaction vessel;

(e) a waveguide connecting openings provided at positions of said reaction vessel at which said two parts of said waveguide being placed such that they face each other, said waveguide connecting openings being connected with said two parts of said waveguide respectively; and (f) microwave introducing windows provided on connecting portions at which said two parts of said waveguide are connected with said reaction vessel, said substrate holder providing an axis of rotation about which said substrate is to be rotated, wherein said substrate holder is provided such that a center axis thereof is inclined against a center axis of said waveguide, and said substrate holder is provided around the center axis of said rotation axis so that it can be freely rotated.

The preferred embodiments of the present invention are described in the following sections with reference to the drawings, from which further objects and advantages of the present invention will become apparent.

BRIEF DESCRIPTION OF THE DRAWINGS

FIG. 8 (b) is a view showing the general layout of a PCVD apparatus according to a fifth embodiment of the present invention;

DETAILED DESCRIPTION OF THE PREFERRED EMBODIMENTS

A First Embodiment

In the following section, a first preferred embodiment of the present invention will be described with reference to FIGS. 1 and 2.

Figure 1:
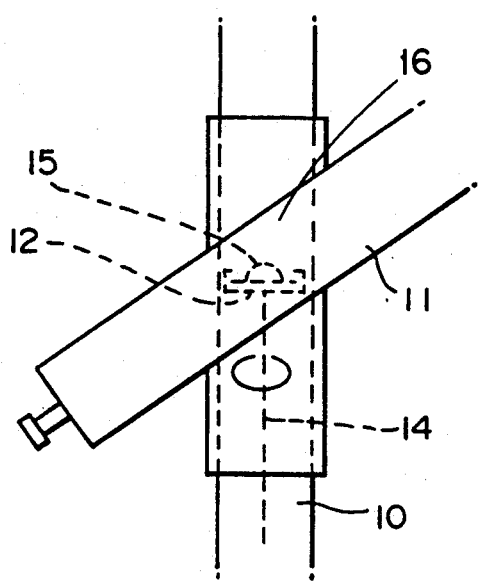
FIG. 1 is a side view showing the configuration of a PCVD apparatus according to a first embodiment of the present invention.

FIG. 1 is a side view showing the configuration of a PCVD apparatus according to the first embodiment of the present invention. The PCVD apparatus shown in FIG. 1 is mainly composed of a reaction tube 10 provided in a vertical direction and a waveguide 11 provided inclined to the reaction tube 10. The reaction tube 10 is inserted through the center portion of the waveguide 11. At the intersection of the reaction tube 10 and the waveguide 11, a reaction vessel 16 is formed, wherein a substrate holder 12 is provided. The substrate holder 12 is horizontally and rotatively supported by a rotation axis 14 which is provided inside the reaction tube 10 in the vertical direction. The lower portion of the rotation axis 14 is connected with a drive apparatus (e.g., a motor, not show), so that the substrate holder 12 can be rotated within a horizontal plane by virtue of the drive apparatus. In addition, the reaction tube 10 is connected with a reaction gas supply source (not shown), which supplies various reaction gases to the reaction vessel 16.

The waveguide 11 is connected with a microwave generating apparatus (i.e., an oscillator) which generates microwaves and supplies them to the interior of the waveguide 11 to thereby generate plasma within the waveguide 11 for heating the substrate holder 12 and the surroundings thereof. In addition, the waveguide 11 is provided such that the center axis thereof is inclined against that of the reaction tube 10 at an angle of 45 degrees, that is, the central axis of the waveguide 11 is inclined against the central axis of the substrate holder 12 and the reaction tube 10. Herein, the angle formed by the reaction tube 10 and the waveguide 11 is set to an arbitrary value in a range between 0 and 90 degrees.

On the substrate holder 12, a substrate 15 is placed which has a three-dimensional form such as a hemisphere, dome, or some other three-dimensional solid form. The substrate 15 is constituted by a material which is preferable for being deposited as a thin film formed on the surface thereof. Additionally, it is preferable to use a material from which it is easy to separate the thin film after deposition as required. In such a case, in order to separate the thin film from the substrate 15, a method may be adopted in which the substrate 15 is removed by being dissolved chemically.

Next, descriptions will be given of the processes for depositing thin films on the substrate 15 using the PCVD apparatus described above.

First, a substrate 15 having a dome shape is placed on the substrate holder 12 provided within the reaction vessel 16, and the reaction gas is supplied to the interior of the reaction vessel 16 from the gas supply source. Thereafter, plasma is generated within the reaction vessel 16 by microwave radiation. In this case, the reaction tube 10 is inclined against the waveguide 11, so that plasma P is generated in an inclined orientation upward from the substrate 15 as shown in FIG. 2. Maintaining this orientation, a thin film is deposited on the surface of the substrate 15 by rotating the substrate holder 12 in a horizontal plane.

Figure 2:
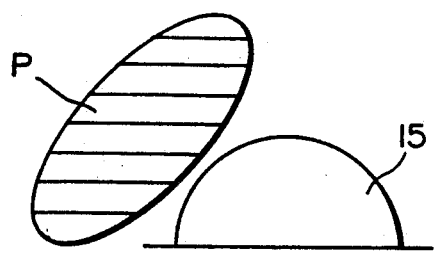
FIG. 2 is a view showing the position relationship between a substrate and plasma in the same preferred embodiment.

In this case, the substrate 15 is rotated such that plasma P is generated at a position opposite to and inclined against the substrate 15 as shown in FIG. 2, so that all portions of the substrate 15 are to be heated uniformly when the plasma P is produced, to the nonuniform heating in the conventional deposition process. In other words, the strong part of plasma P is generated under the specific orientation in which the center axis of the plasma P is inclined against that of the substrate 15, so that, by rotating the substrate 15, the relative position relationship between each part of the surface of the substrate 15 and the strong part of plasma P is varied. Accordingly, the heating by the plasma P can be uniform on the surface of the substrate 15. As a result, if the entire substrate 15 is uniformly heated, the deposition of the thin film on the surface of the substrate 15 is improved. Thus, in the case where the reaction gas supplied to the reaction tube 10 is decomposed into its components by the plasma P to thereby deposit the components on the substrate 15, the thin film can be more uniformly deposited on the entire surface of the substrate 15 when compared with the conventional deposition process. In this case, the thickness variations in the thin film can be reduced to less than 10 percent.

B SECOND EMBODIMENT

Figure 3:
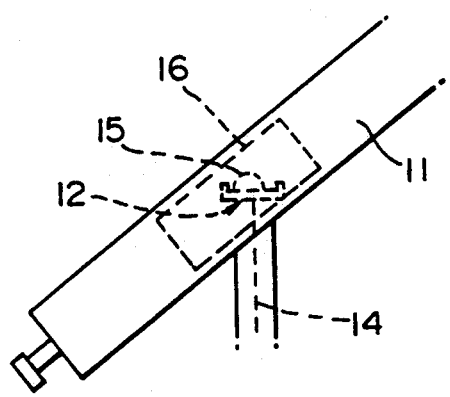
FIG. 3 is a side view showing the configuration of a PCVD apparatus according to a second embodiment of the present invention.

Next, description will be given with respect to the second embodiment of the present invention by referring to FIG. 3. In FIG. 3. parts identical to those shown in FIG. 1 will be designated by the same numerals, and hence, description thereof will be omitted.

The waveguide 11 is designed to incline against the substrate holder 12 and the reaction vessel 16 is provided within the waveguide 11 as in the first embodiment. However, the reaction tube described in the previous embodiment is not provided in this embodiment, and the substrate holder 12 is horizontally and rotatively supported by a rotation axis 14 which is connected with a drive apparatus so as to be rotated.

In this embodiment, the waveguide 11 is also inclined against the substrate holder 12, so that an effect identical to that of the first embodiment can be obtained.

C Third Embodiment

Figure 7:
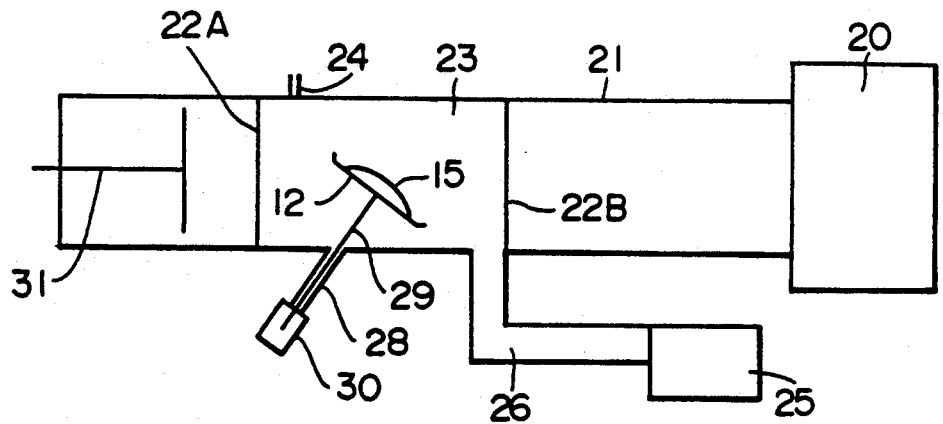
FIG. 7 is a view showing the general layout of a PCVD apparatus according to a third embodiment of the present invention.

Next, description will be given of an embodiment of the present invention by referring to FIG. 7, which shows the general layout of a PCVD apparatus according to the third embodiment. In FIG. 7, a microwave oscillator 20 is connected with a waveguide 21. In part of waveguide 21, vessel walls 22A and 22B are provided to thereby form the reaction vessel 23 which consists of quartz, or the like. A gas supply tube 24 is connected to the reaction vessel 23 for supplying the reaction gas thereto from the reaction gas source. The gas supply tube 24 is inserted through the peripheral wall of the waveguide 21 and is communicated with the reaction vessel 23. In addition, the reaction vessel 23 is connected with one end of an exhaust tube 26 for exhausting air in the reaction vessel 23 to the outside. The exhaust tube 26 is inserted through the peripheral wall of the waveguide 21, and the other end of the exhaust tube 26 is connected with an exhaust pump 25 for pumping air out of the reaction vessel 23. In order to reduce leakage of the electromagnetic waves, it is preferable for the gas supply tube 24 and the exhaust tube 26 to be as small in as diameter possible. The reaction tube 23 is connected with a pipe 28 which is inserted through the peripheral wall of the waveguide 21. The pipe 28 is inclined against the center axis of the waveguide 21. A rotation axis 29 is inserted into the pipe 28, so that it can rotate freely; the top portion of the rotation axis 29 is inside the reaction vessel 23 and the bottom portion thereof passes out of the reaction vessel 23. The substrate holder 12, as in the first embodiment, is secured to the top portion of the rotation axis 29. The bottom portion of the rotation axis 29 is connected with a rotation axis of a motor 30. Similarly, in order to reduce the leakage of electromagnetic waves, it is also preferable that the pipe 28 be of as small a diameter as possible. In addition, numeral 31 designates a tuning plunger which moves within the waveguide 21 and ensures maximum coupling of the microwave energy with the reaction gas.

In the PCVD apparatus described above, as well as in the foregoing apparatus, the substrate 15 is placed on the substrate holder 12, and the substrate 15 is rotated thereby. Thereafter, by generating the plasma within the reaction vessel 23 and supplying the reaction gas thereto, a thin film can be deposited on the surface of the substrate 15. Additionally, the rotation axis 29 is inclined against the center axis of the waveguide 21 in this embodiment so that a thin film having a uniform thickness can be deposited on the entire surface of the substrate 15. Furthermore, in this embodiment, the reaction vessel 23 is formed by dividing the interior of the waveguide 21 by means of two vessel walls 22A and 22B, so that there is no disadvantage if the electromagnetic waves leaks as there would be in the conventional apparatus, even if the reaction vessel 23 is large. In other words, the reaction vessel 23 can be large compared with the maximum size in the conventional apparatus. Thus, even if the substrate 15 is relatively large, the thin film can be deposited within the reaction vessel 23. In addition, the rotation axis 29 inserted through the waveguide 21 can be relatively short compared with that of the first embodiment, so that the deviations of thin film thickness caused by the oscillation of the neck of the rotation axis 29 is reduced, compared with that of a long rotation axis, when the substrate 15 is rotated. As a result, the rotation of the substrate holder 12 is more stable, so that the reproductively of thin film can be satisfied in the case of repeatedly depositing.

D Forth Embodiment

Figure 8:
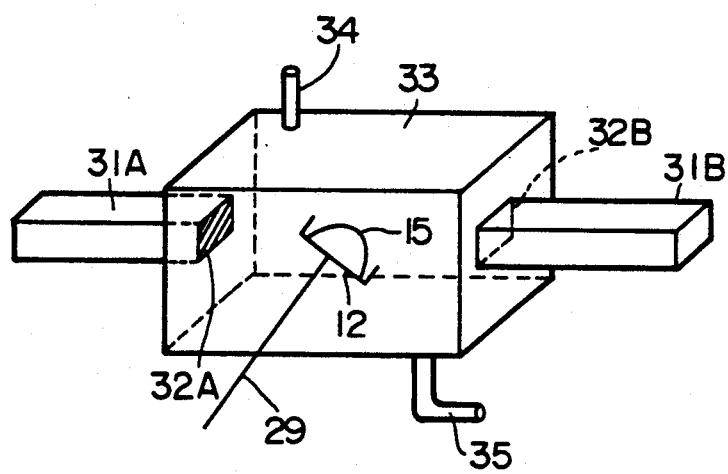
FIG. 8 (a) is a view showing the general layout of a PCVD apparatus according to a forth embodiment of the present invention.
Figure 8:
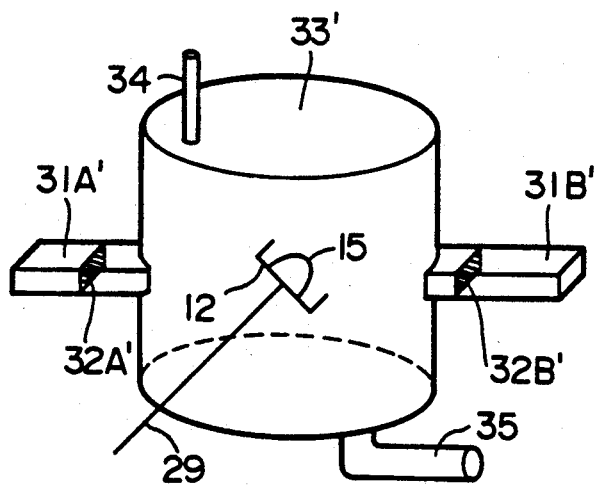

Next, description will be given with respect to the forth embodiment of the present invention by referring to FIG. 8(a). FIG. 8(a) is a view showing the general layout of a PCVD apparatus according to the forth embodiment of the present invention. In FIG. 8(a), parts identical to those shown in FIG. 7 will be designated by the same numerals, and hence, description thereof will be omitted.

Referring to FIG. 8(a), 31A and 31B designate waveguides, and 33 designates a box-type reaction vessel. One of the waveguides 31A and 31B, (e.g., the waveguide 31A) is connected with a microwave oscillator (not shown). Waveguide connecting openings are provided respectively on both sides of the reaction vessel 33. These waveguide connecting openings are connected respectively with the ends of the waveguides 31A and 31B. On the waveguide connecting openings are respectively provided microwave introduction windows 32A and 32B which are made of quartz, etc., and which are capable of sealing the reaction vessel 33. In addition, 34 designates a gas supply tube, and 35 designates an exhaust tube.

In this embodiment, the waveguides 31A and 31B are also inclined with respect to the substrate holder 12, so that an effect identical to that of the second embodiment can be obtained. In addition, the waveguides 31A and 31B are designed to be divided into two parts and are connected with the reaction vessel 33, so that the size and form of the reaction vessel can be optionally selected, and as a result, the thin film can be deposited on larger substrates compared with the conventional apparatus.

E Fifth Embodiment

Next, description will be given with respect to the fifth embodiment of the present invention by referring to FIG. 8(b). FIG. 8(b) is a view showing the general layout of a PCVD apparatus according to the fifth embodiment of the present invention. In FIG. 8(b), parts identical to those shown in FIG. 8(a) will be designated by the same numerals, and hence, description thereof will be omitted.

Referring to FIG. 8(b), 31A' and 31B' designate waveguides, 33' designates a reaction vessel which is cylindrical. One of the waveguides 31A' and 31B', (e.g., the waveguide 31A') is connected with a microwave oscillator (not shown). On the opposite peripheral walls of the reaction vessel 33' are provided waveguide connecting openings respectively in such a manner as to face each other. These waveguide connecting openings are respectively connected with the ends of the waveguides 31A' and 31B'. Inside the waveguides 31A' and 31B', microwave introduction windows 32A' and 32B' are respectively provided, and these windows 324' and 32B' are in spaced relationship with the waveguide connecting openings. These microwave introduction windows 32A' and 32B' are made of quartz, etc., and are capable of sealing the reaction vessel 33'.

In this embodiment, the waveguide 31A' and 31B' are also inclined with respect to the substrate holder 12, so that an effect identical to that of the above forth embodiment can be obtained.

F First Example of the Manufacturing of a Thin Film

Next, description will be given with respect to a first example of the manufacturing of a thin film. In this example, a diamond thin film is manufactured by using the PCVD apparatus which is constructed as shown in FIG. 1, wherein the angle of inclination formed between the reaction tube 10 and the waveguide 11 is set at 45 degrees. The conditions for generating the plasma are as follows:

$H_2$ gas at 200 cc/min and $CH_4$ gas at 1 cc/min are introduced into the reaction tube 10. The pressure in the reaction tube 10 is set at 50 Torr and the power of the microwaves at a frequency of 2450 MHz supplied to the reaction tube 10 is set at 350 watts.

The substrate, which consists of a single hemispherical silicon crystal having a radius of 10 mm, is used as the substrate and is placed on the substrate holder in the reaction tube. In addition, when the temperature of the substrate is 850° C., the substrate is rotated at 10 rpm, and the reaction time is set at 200 hrs, resulting in the deposition of a diamond thin film on the surface of the substrate.

Figure 4:
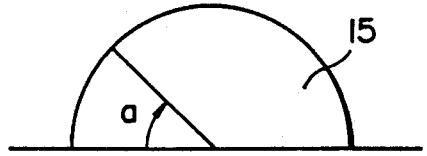
FIG. 4 is a view to explain the position at which the thickness of the thin film is measured.
Figure 5:
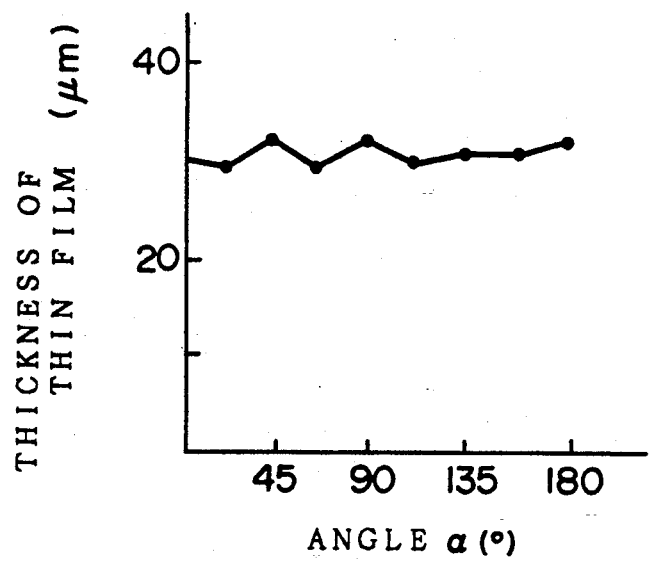
FIG. 5 is a graph showing the thickness distribution of the thin film formed by the PCVD apparatus according to the first embodiment of the present invention.

The hemispherical substrate, on which the diamond thin film forms, is cut along the surface passed through the center placed on the bottom face (i.e., circle) thereof, thereafter, the thickness of the thin film formed on each portion of the outer periphery of the cross section shaped semi-circle cut (see the semi-circle in FIG. 4) is measured. The results of these measurements are shown in FIG. 5, wherein the angle by $a$ is the angle of elevation of the center placed on the semi-circle from each portion of the outer periphery of the cross section shaped semi-circle. As can be seen in FIG. 5, by using the PCVD apparatus according to the present invention, the diamond thin film has a greatly reduced variation in thickness. In this case, variation in the thin film thickness is within 10% of the average thin film thickness. The angle of inclination in a range between 10 and 80 degrees is preferable to suppress the thickness variations within $-20\%$ to $+20\%$.

Figure 6:
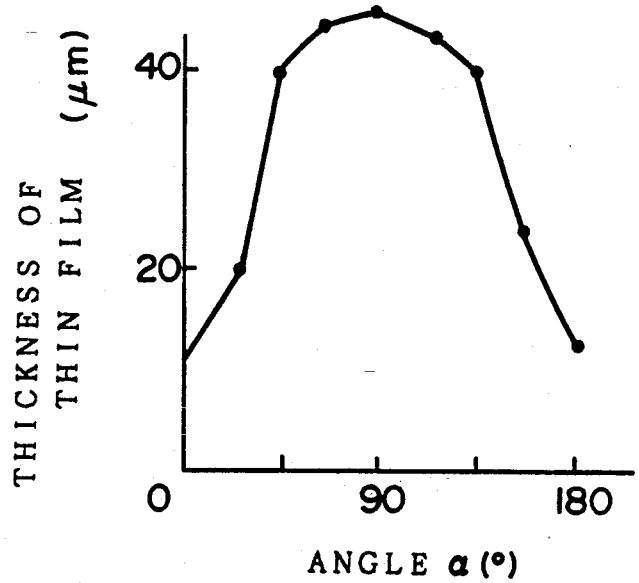
FIG. 6 is a graph showing thickness distribution of the thin film formed by the conventional PCVD apparatus.

On the other hand, FIG. 6 shows the results when the thin film is deposited on the surface of the substrate described above under the conditions identical to the above-mentioned case by using the conventional PCVD apparatus in which the reaction tube is provided in the vertical direction against the waveguide. As can be seen in FIG. 6, the ratio of the thickest portion to the thinnest portion is 4:1.

As described heretofore, it is demonstrated that a thin film can be deposited on the surface of a three-dimensional body, wherein the variation of the thin film thickness is reduced to within 10% of the average thin film thickness; and a more uniform thin film thickness is produced by use of the PCVD apparatus according to the present invention than by the use of a conventional apparatus.

G Second Example of the Manufacturing of the Thin Film

Figure 11:
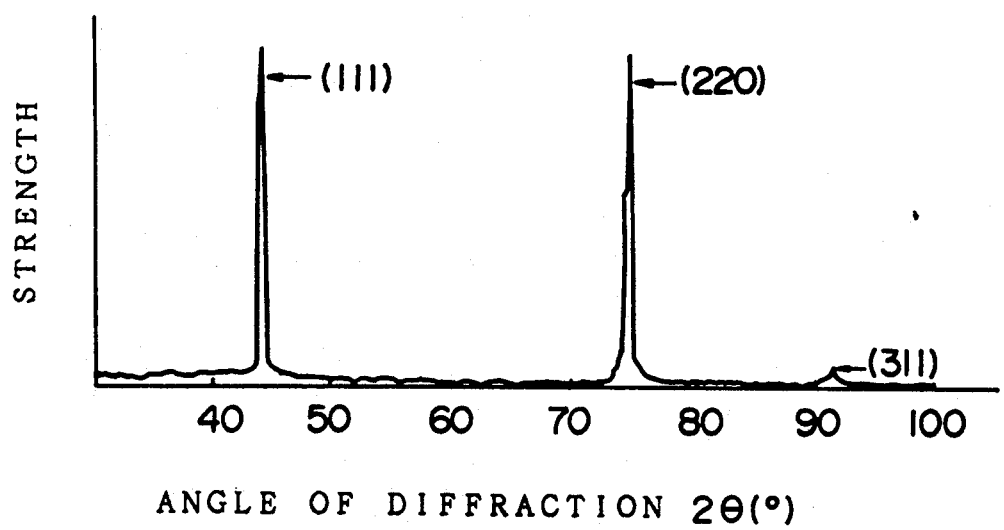
FIG. 11 is a view showing an X-ray diffraction of a diamond thin film.
Figure 12:
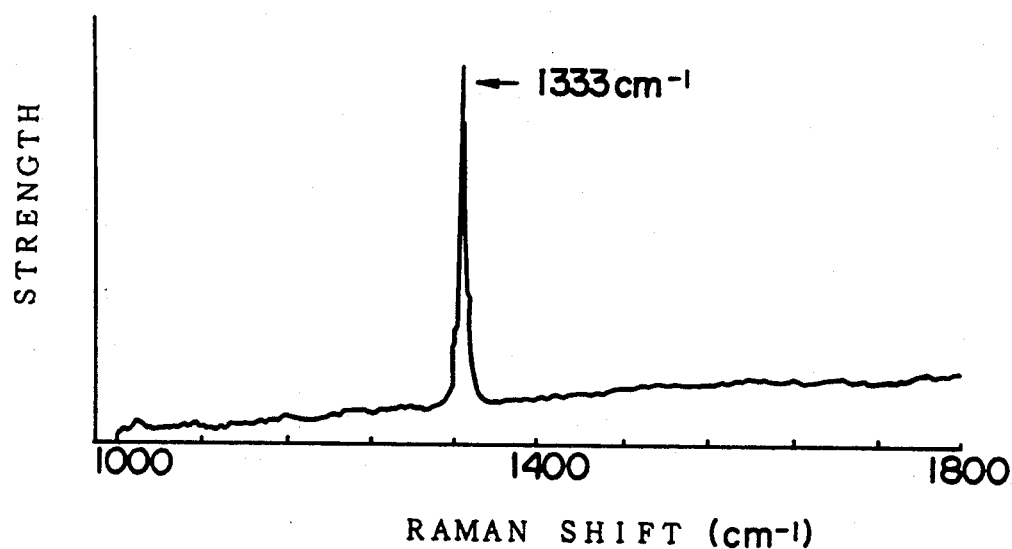
FIG. 12 is a graph showing a Raman spectrum of a diamond thin film.
Figure 13:
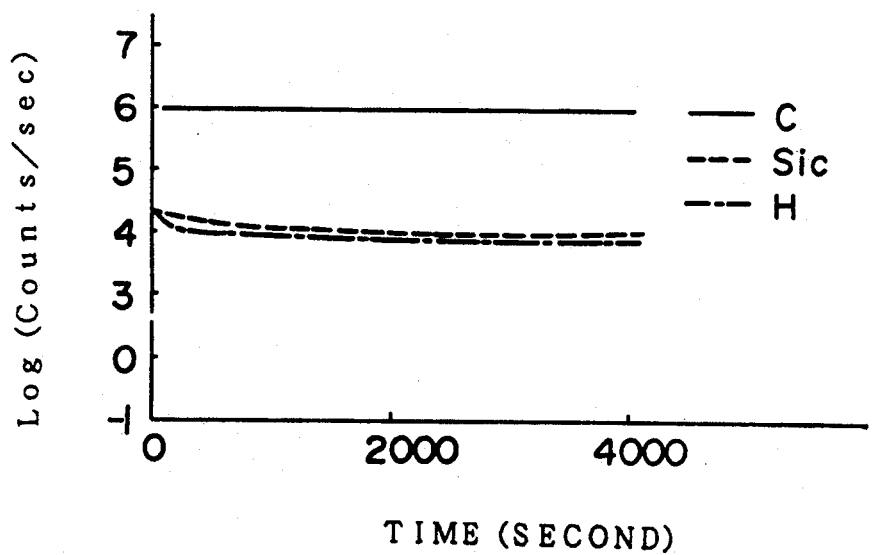
FIG. 13 is a graph showing measured results of a diamond thin film by using a secondary ion mass spectrometry.
Figure 14:
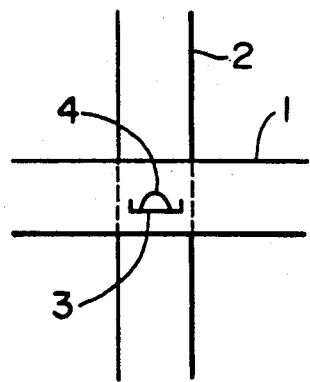
FIG. 14 is a view showing an example of the configuration of a conventional PCVD apparatus.
Figure 15:
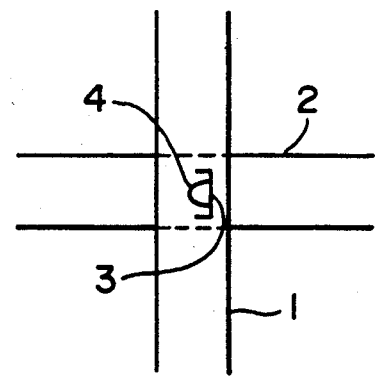
FIG. 15 is a view showing another example of the configuration of a conventional PCVD apparatus.
Figure 16:
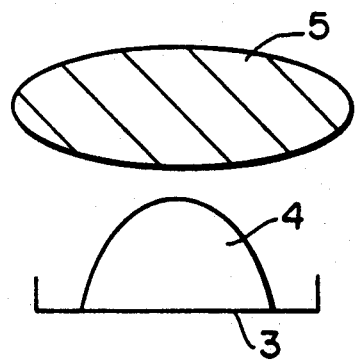
FIG. 16 is a view showing the relationship between a substrate and plasma in the PCVD apparatus shown in FIG. 14.
Figure 17:
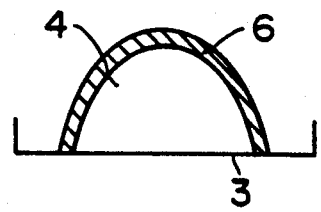
FIG. 17 is a sectional view showing a thin film formed on a substrate.

Next, description will be given with respect to a second example of the manufacturing of a thin film. In this example, the diamond thin film is manufactured by using the PCVD apparatus constructed as shown in FIG. 7, wherein the reaction vessel 23 (length, 130 mm) is formed in proportion to the waveguide standard WRT-2 and provided between the plunger and the oscillator, and furthermore, the substrate (diameter, 60 mm) consists of a flat silicon (Si) body is placed in the reaction vessel 23. In addition, the air within the reaction vessel 23 is removed by the vacuum pump, and thereafter, the reaction gases $H_2$ gas and $CH_4$ gas are mixed so that $CH_4$ gas is 0.5% by volume, and the mixture is introduced into the reaction vessel 23 to produce pressure of 20 Torr. Next, microwaves at a frequency of 2450 MHz generated by the oscillator are introduced into the reaction vessel 23, so that a plasma is nearly produced within the reaction vessel 23. In addition, at that time, the temperature of the surface of the substrate may increase more than 800° C. without the use of any other heating means. Under these conditions, when the thin film has been undergoing deposition for 100 hrs, a thin film begins to substantially form on the surface of the silicon substrate. FIG. 11 shows the result of an X-ray diffraction of the diamond thin film thus obtained. FIG. 12 shows the result of the Raman spectrum of the diamond thin film thus obtained. Additionally, FIG. 13 shows the measurements of the diamond thin film using secondary ion mass spectrometry (so-called SIMS). As can be seen in FIGS. 11 to 13, it has been confirmed that the diamond thin film is formed over the entire surface of the substrate without impurity defects.

Figure 9:
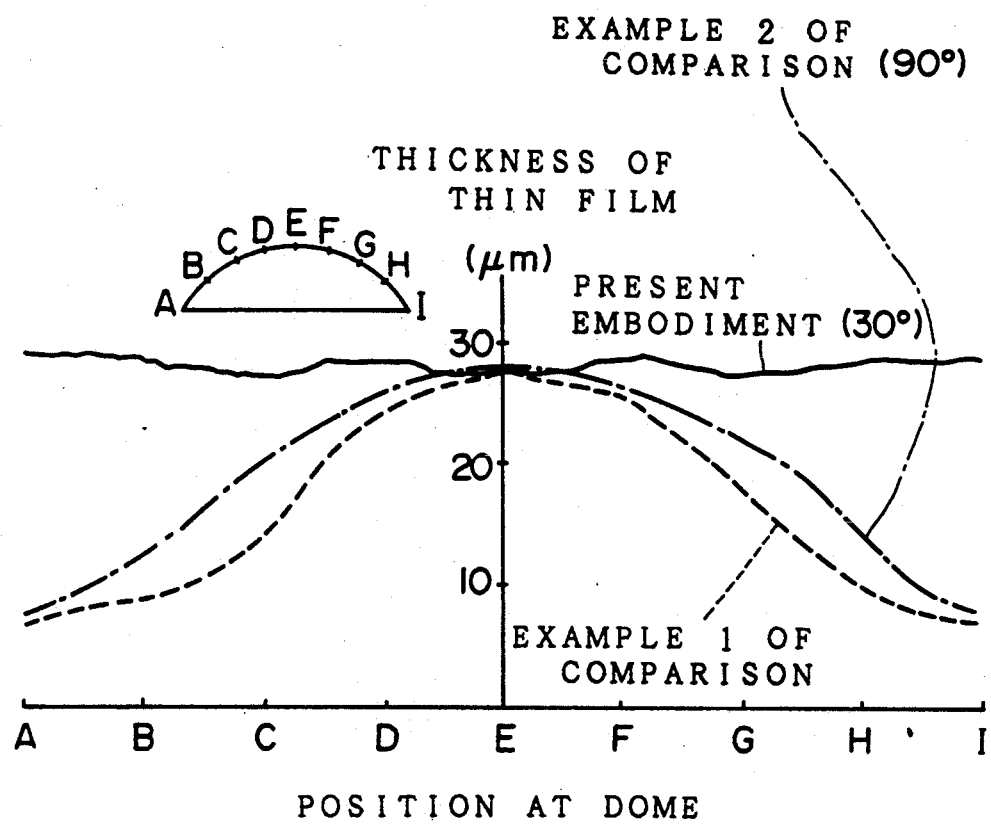
FIG. 9 is a graph showing the thickness distributions of the thin film formed by the PCVD apparatus according to the third embodiment of the present invention and the conventional PCVD apparatus.

On the other hand, the dome-shaped silicon substrate (plane diameter 60 mm, height 16 mm) is placed into the reaction vessel 23 in such manner as to incline 30 degrees against the progressing direction of the electromagnetic wave, and plasma is generated under the same conditions described above, so that the diamond thin film is deposited on the substrate over a period of approximately 250 hrs. At this time, though the substrate is rotated at 50 rpm, the temperature of the surface of the substrate may increase to within 10% of 850° C. The measured result, the thicknesses of each portion of the diamond thin film thus obtained, is shown in FIG. 9. As can be seen in FIG. 9, it has been confirmed that a diamond thin film of uniform thickness can be formed on the surface of the dome-shaped substrate by using the PCVD apparatus according to the present invention.

H Examples of a Comparison Thin Film of the Prior Art

Next, description will be given with respect to examples of a comparison thin film.

Figure 10:
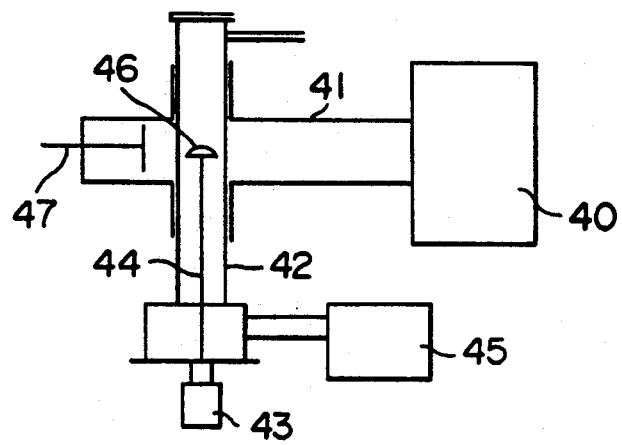
FIG. 10 is a view showing another example of the general layout of a conventional PCVD apparatus.

In order to compare the effect of the present invention with that of the conventional apparatus, by using the conventional apparatus constructed as shown in FIG. 10, a thin film is deposited on the surface of a substrate which is identical to the foregoing silicon substrate having an outer diameter of 25 mm and shaped like a dome. FIG. 10 illustrates an oscillator 40 which generates microwaves, a waveguide 41, a reaction tube 42 provided in such a manner as to inserted through the waveguide 41, a motor 43, a rotation axis 44, an exhaust apparatus 45, a substrate 46, and a tuning plunger 47. With this apparatus, the thin film is deposited on the substrate 46 by use of the same reaction gas under the same conditions for generating the plasma described above. However, the thickness distribution of this diamond thin film shown by the broken line in FIG. 9, when compared to example 1, is not as uniform. Incidentally, the conventional apparatus shown in FIG. 10 has the ability to treat a dome-shaped substrate having a maximum diameter of 40 mm, whereas the apparatus shown in FIG. 7 based on the present invention can treat a dome-shaped substrate having a maximum diameter of 60 mm.

As an another comparison, by using the PCVD apparatus according to the third embodiment, a diamond thin film is deposited under the condition in which the substrate is inclined against the progressing direction of the microwaves at about 90 degrees and under other conditions identical to above-mentioned case. In this case, the thickness distribution of this diamond thin film is shown by the alternate long and short dashed line in FIG. 9. and accordingly, it is again apparent that the thin film thickness is highly variable. As a result, by inclining the substrate against the progressing direction of the microwaves, it is demonstrated that the thickness distribution of the diamond thin film can be evened out.

In addition, by using the PCVD apparatus constructed in accordance with the present invention, a thin film may be deposited on the surface of the substrate shaped like a dome, after which if the substrate itself is removed by chemical treatment, a thin film body can be obtained. As a result, this structural element can be used as the vibration body in a speaker, or the like. In this case, the vibration body of a uniform thickness can be obtained.

In the present specification, preferred embodiments of the plasma-enhanced chemical vapor deposition apparatus of the present invention are described. The described embodiments are meant to be illustrative, however, and are not intended to represent limitations. Accordingly, numerous variations and enhancements thereto are possible without departing from the spirit or essential character of the present invention as described. The present invention should therefore be understood to include any apparatus and variations thereof encompassed by the scope of the appended claims.

What is claimed is:

1. A chemical vapor deposition apparatus for depositing a thin film on a substrate according to a chemical vapor deposition method by using plasma energy and reaction gas, said chemical vapor deposition apparatus comprising:

(a) a waveguide for guiding microwaves therein:

(b) a reaction tube inserted through said waveguide, said reaction tube connected with a reaction gas source, wherein the reaction gas is introduced into said reaction tube from said reaction gas source; and (c) a substrate holder for holding said substrate therein, said substrate holder being placed at an intersection of said reaction tube and said waveguide, said substrate holder providing a single rotation axis about which said substrate is to be rotated, wherein said waveguide is provided such that a center axis thereof is inclined relative to a center axis of said substrate holder, and said substrate holder is provided around the center axis of said rotation axis so that said substrate holder is free to rotate.

2. A chemical vapor deposition apparatus according to claim 1, wherein said substrate is shaped in a three-dimensional structure such a a semi-sphere.

3. A chemical vapor deposition apparatus according to claim 1, wherein the center axis of said substrate holder is inclined relative to a center axis of said waveguide at 45 degrees.

4. A chemical vapor deposition apparatus according to claim 1, wherein an angle formed between said center axis of said substrate holder and said center axis of said waveguide is selected in a range between greater than 0 and 90 degrees.

5. A chemical vapor deposition apparatus for depositing a thin film on a substrate according to a chemical vapor deposition method by using plasma energy and reaction gas, said chemical vapor deposition apparatus comprising:

(a) a waveguide connected to an oscillator for generating microwaves to be introduced therein;

(b) a reaction vessel provided in said waveguide by partitioning off said waveguide;

(c) a reaction gas introduction port provided in said reaction vessel, by which said reaction gas is introduced into said reaction vessel;

(d) a pumping means for pumping air out of said reaction vessel; and (e) a substrate holder for holding said substrate therein, said substrate holder being provided within said reaction vessel, said substrate holder providing a single rotation axis for rotating said substrate, wherein said substrate holder is provided such that a center axis thereof is inclined relative to a center axis of said waveguide, and said substrate holder is provided around the center axis of said rotation axis so that said substrate holder is free to rotate.

6. A chemical vapor deposition apparatus according to claim 5, wherein said substrate is shaped in a three-dimensional structure such as a semi-sphere.

7. A chemical vapor deposition apparatus according to claim 5, wherein the center axis of said substrate holder is inclined relative to a center axis of said waveguide by 45 degrees.

8. A chemical vapor deposition apparatus according to claim 5, wherein an angle between said center axis of said substrate holder and said center axis of said waveguide is selected in a range between greater than 0 and 90 degrees.

9. A chemical vapor deposition apparatus for depositing a thin film on a substrate according to a chemical vapor deposition method by using plasma energy and reaction gas, said chemical vapor deposition apparatus comprising:

(a) a reaction vessel connected with a gas introduction tube for introducing the gas therein and a gas exhaust tube for exhausting air from said reaction vessel;

(b) a waveguide connected with an oscillator for generating microwaves to be introduced therein, said waveguide being divided into two parts;

(c) a pumping means for pumping air out of said reaction vessel;

(d) a substrate holder for holding said substrate therein, said substrate holder being provided within said reaction vessel;

(e) waveguide connecting openings provided at positions of said reaction vessel at which said two parts of said waveguide are placed such that they face each other, said waveguide connecting openings being connected with said two parts of said waveguide respectively; and (f) microwave introducing windows provided on connecting portions at which said two parts of waveguide are connected with said reaction vessel, said substrate holder providing a single axis of rotation about which said substrate is to be rotated, wherein substrate holder is provided such that a center axis thereof is inclined relative to a center axis of said waveguide, and said substrate holder is provided around the center axis of said rotation axis so that said substrate holder is free to rotate.

10. A chemical vapor deposition apparatus according to claim 9, wherein said substrate is shaped in a three-dimensional structure such as a semi-sphere.

11. A chemical vapor deposition apparatus according to claim 9, wherein the center axis of said substrate holder is inclined relative to a center axis of said waveguide by 45 degrees.

12. A chemical vapor deposition apparatus according to claim 9, wherein an angle between said center axis of said substrate holder and said center axis of said waveguide is selected in a range between greater than 0 and 90 degrees.

* * * * *